(12) United States Patent
Lenssen et al.

(10) Patent No.: US 7,712,147 B2
(45) Date of Patent: May 4, 2010

(54) METHOD AND DEVICE FOR PROTECTION OF AN MRAM DEVICE AGAINST TAMPERING

(75) Inventors: Kars-Michiel Hubert Lenssen, Eindhoven (NL); Robert Jochemsen, Eindhoven (NL)

(73) Assignee: NXP B.V., Eindhoven (NL)

( * ) Notice: Subject to any disclaimer, the term of this patent is extended or adjusted under 35 U.S.C. 154(b) by 1357 days.

(21) Appl. No.: 10/539,548

(22) PCT Filed: Dec. 15, 2003

(86) PCT No.: PCT/IB03/06005

§ 371 (c)(1),
(2), (4) Date: Jun. 16, 2005

(87) PCT Pub. No.: WO2004/055824

PCT Pub. Date: Jul. 1, 2004

(65) Prior Publication Data

US 2006/0179490 A1    Aug. 10, 2006

(30) Foreign Application Priority Data

Feb. 20, 2003    (EP) .................................. 03100402

(51) Int. Cl.
*G06F 11/30* (2006.01)
*G06F 12/14* (2006.01)
*G11C 19/08* (2006.01)
*G11C 15/02* (2006.01)
*G11C 11/06* (2006.01)
*G11C 11/00* (2006.01)

(52) U.S. Cl. ............................ 726/34; 713/194; 365/1; 365/50; 365/55; 365/158; 257/659

(58) Field of Classification Search ................... 726/34; 713/194

See application file for complete search history.

(56) References Cited

U.S. PATENT DOCUMENTS

| | | | | |
|---|---|---|---|---|
| 5,902,690 A | * | 5/1999 | Tracy et al. | 428/814 |
| 6,172,902 B1 | * | 1/2001 | Wegrowe et al. | 365/158 |
| 6,219,789 B1 | * | 4/2001 | Little et al. | 726/34 |
| 6,501,678 B1 | * | 12/2002 | Lenssen et al. | 365/173 |
| 6,522,577 B1 | * | 2/2003 | Earl et al. | 365/158 |
| 6,650,564 B1 | * | 11/2003 | Earl et al. | 365/158 |
| 7,205,883 B2 | * | 4/2007 | Bailey | 340/5.3 |
| 7,224,634 B2 | * | 5/2007 | Lenssen et al. | 365/228 |

(Continued)

OTHER PUBLICATIONS

Lenssen, Kars-Michiel H. et al. Expectations of MRAM in comparison with other non-volatile memory technologies. NVMT Symposium. 2000. p. 1-24.*

*Primary Examiner*—Christian LaForgia

(57) ABSTRACT

Data, stored in MRAM-cells (12) should be protected against misuse or read-out by unauthorised persons. The present invention provides an array (10) of MRAM-cells (12) provided with a security device (14) for destroying data stored in the MRAM-cells (12) when they are tampered with. This is achieved by placing a permanent magnet (16) adjacent the MRAM-array (10) in combination with a soft-magnetic flux-closing layer (18). As long as the soft-magnetic layer (18) is present, the magnetic field lines (20) from the permanent magnet (16) are deviated and flow through this soft-magnetic layer (18). When somebody is tampering with the MRAM-array (10), e.g. by means of reverse engineering, and the flux-closing layer (18) is removed, the flux is no longer deviated and affects the nearby MRAM-array (10), thus destroying the data stored in the MRAM-cells (12).

6 Claims, 3 Drawing Sheets

U.S. PATENT DOCUMENTS

| | | | |
|---|---|---|---|
| 7,485,976 B2 * | 2/2009 | Knudsen | 726/34 |
| 2001/0033012 A1 | 10/2001 | Koemmerling et al. | |
| 2002/0008988 A1 * | 1/2002 | Lenssen et al. | 365/158 |
| 2004/0032010 A1 * | 2/2004 | Kools et al. | 257/659 |
| 2005/0045998 A1 * | 3/2005 | Kools et al. | 257/659 |
| 2005/0230788 A1 * | 10/2005 | Kato et al. | 257/659 |
| 2006/0081497 A1 * | 4/2006 | Knudsen | 206/701 |
| 2006/0108668 A1 * | 5/2006 | Knudsen | 257/659 |
| 2006/0146597 A1 * | 7/2006 | Lenssen et al. | 365/158 |
| 2007/0139989 A1 * | 6/2007 | Knudsen | 365/48 |

* cited by examiner

METHOD AND DEVICE FOR PROTECTION OF AN MRAM DEVICE AGAINST TAMPERING

The present invention relates to magnetic or magnetoresistive random access memories (MRAMs), and more particularly to a method and device for protecting MRAM cells against tampering.

Magnetic or Magnetoresistive Random Access Memory (MRAM) is currently being considered by many companies as a successor to flash memory. It has the potential to replace all but the fastest static RAM (SRAM) memories. This makes MRAM very suitable as embedded memory for System on Chip (SoC). It is a non-volatile memory (NVM device, which means that no power is required to sustain the stored information. This is seen as an advantage over most other types of memory.

The MRAM concept was originally developed at Honeywell Corp. USA, and uses magnetization direction in a magnetic multilayer device as information storage and the resultant resistance difference for information readout. As with all memory devices, each cell in an MRAM array must be able to store at least two states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR or Magnetic Tunnel Junction (MTJ) or Spin Dependent Tunneling (SDT) effect provide possibilities to realize a.o. non-volatile magnetic memories. These devices comprise a stack of thin films of which at least two are ferromagnetic or ferrimagnetic, and which are separated by a non-magnetic interlayer. GMR is the magneto-resistance for structures with conductor interlayers and TMR is the magneto-resistance for structures with dielectric interlayers. If a very thin conductor is placed between two ferromagnetic or ferrimagnetic films, then the effective in-plane resistance of the composite multilayer structure is smallest when the magnetization directions of the films are parallel and largest when the magnetization directions of the films are anti-parallel. If a thin dielectric interlayer is placed between two ferromagnetic or ferrimagnetic films, tunneling current between the films is observed to be the largest (or thus resistance to be the smallest) when the magnetization directions of the films are parallel and tunneling current between the films is the smallest (or thus resistance the largest) when the magnetization directions of the films are anti-parallel.

Magneto-resistance is usually measured as the percentage increase in resistance of the above structures going from parallel to anti-parallel magnetization states. TMR devices provide higher percentage magneto-resistance than GMR structures, and thus have the potential for higher signals and higher speed. Recent results indicate tunneling giving over 40% magneto-resistance, compared to 10-14% magneto-resistance in good GMR cells.

A typical MRAM device comprises a plurality of magnetoresistive memory elements, e.g. magnetic tunneling junction (MTJ) elements, arranged in an array. MTJ memory elements generally include a layered structure comprising a fixed or pinned layer, a free layer and a dielectric barrier in between. The pinned layer of magnetic material has a magnetic vector that always points in the same direction. The magnetic vector of the free layer is free, but constrained within the easy axis of the layer, which is determined chiefly by the physical dimensions of the element. The magnetic vector of the free layer points in either of two directions: parallel or anti-parallel with the magnetization direction of the pinned layer, which coincides with the said easy axis. The fundamental principle of MRAM is the storage of information as binary data, e.g. as "0" and "1", based on directions of magnetization. This is why the magnetic data is non-volatile and will not change until it is affected by an external magnetic field. When both magnetic films of the layered structure of an MRAM-cell are magnetized with the same orientation (parallel), the data is either of two binary values, e.g. "0", otherwise, if both magnetic film of the layered structure of the MRAM-cell are magnetized with inverse orientation (anti-parallel), the data is the other binary value, e.g. "1". Making use of the fact that the resistance of the layered structure varies depending on whether or not the orientations are parallel, the system can discriminate both binary values of the data, e.g. "0" or "1".

For certain applications, for example in smartcards, the data stored in the MRAM-cells is secret. It is essential that the data is secure, and cannot be retrieved in other ways than via the normal, controlled electrical connections, e.g. from the pins of an IC. The data has to be protected to prevent anyone from reading it in an unauthorized way.

In WO 00/07184 this problem is being solved by using a recordable data layer within a perishable information storage mechanism, which in response to at least one of a predetermined use or a time factor is perishable, and thus eliminates access to the recorded data.

One of the embodiments described is in MRAM technology, where magnetoresistive memory cells each include a magnetic memory cell element such as a multilayer GMR material, in which data is stored in the form of magnetizing vectors. Data stored in the MRAM-cells is read by a reader which has the ability to exert magnetic fields sufficient to erase the data. Therefore, while reading or accessing information, a magnetic field which destroys the recorded data is produced.

A disadvantage of the solution described above is the fact that recorded data becomes inaccessible even if it is not being misused. Access to the data is denied or data is destroyed even if it is just used in a normal and authorized way.

Accordingly, it is highly desirable, for certain applications, for example smartcards, to provide a security device such that data stored in MRAM-cells cannot be retrieved in other ways than through the normal, controlled electrical connections from the pins of the IC. It would be useful to provide a memory device in which the stored data would be corrupted automatically when there is tampered with the memory device, but which does not alter the stored data during normal use.

It is an object of the present invention to provide a hardware protection against tampering that can easily be added to an embedded or stand-alone MRAM-array, especially in applications where security is essential or in which the integrity of data is crucial.

The above objective is accomplished by a method and device according to the present invention.

The present invention provides an array of MRAM-cells provided with a security device for destroying data stored in the MRAM-cells when the array is subject to tampering, wherein the security device is a magnetic device. An advantage of the present invention is that data content of MRAM cells is destroyed when the MRAM-array is tampered with, e.g. by removing its protective shielding, but not when it is used normally.

According to one embodiment of the present invention the security device may comprise a magnetic field source in combination with a first soft-magnetic flux-closing layer. The security device can be easily added to an embedded or stand-alone MRAM-array. The magnetic field source may for example be a permanent magnet or an electromagnet. The permanent magnet has an advantage of being passive, i.e. it does not require power to operate, nor does it require the device being operated. An electromagnet may generally be less preferred, because in that case the protection only works during operation of the MRAM-array. It may however be useful, for example when the MRAM-array is used like an SRAM (Static Random Access Memory) device for temporary storage of data.

According to the present invention the security device may be built near the array of MRAM-cells, and this in any direction, i.e. next to the MRAM-cells, underneath the MRAM-cells or on top of the MRAM-cells. The distance between the security device and the MRAM-cells is such that, in case of tampering, the magnetic flux lines of the security device, go through the MRAM-cells thus destroying their data content when the MRAM-array is tampered with.

Furthermore, according to the present invention, when the MRAM-cells are built on a first surface of a substrate, the security device may be built at the side of the substrate corresponding to this first surface, or at the side of the substrate corresponding to a second surface, which second surface is opposite to the first surface of the substrate. A plurality of security devices may also be provided. They may be dispersed over the substrate. They may either be located all at the side corresponding to the first surface of the substrate, or all at the side corresponding to the second surface of the substrate, or at least one at the side corresponding to the first surface and at least one at the side corresponding to the second surface.

According to the present invention the first soft-magnetic flux-closing layer may be so as to separate from the magnetic field source when the array of MRAM-cells is tampered with. Through this the magnetic flux lines of the security device are no longer deviated and go through the MRAM-cells, thus destroying their data content by aligning all magnetic fields of the free layers of the MRAM-cells.

According to another embodiment of the present invention the security device may furthermore comprise a magnetic field shaping device. The magnetic field shaping device may for example be a second soft-magnetic layer being located adjacent the array of MRAM-cells at the opposite side (with respect to the MRAM-cells) of the magnetic field source and first soft-magnetic layer. An advantage of this embodiment is a better guiding of the magnetic field lines of the security device so as to destroy the data content of the MRAM-cells when the array is tampered with.

According to yet another embodiment of the present invention the first soft-magnetic layer and/or the second soft-magnetic layer may be part of a shielding layer of the MRAM-array. An advantage hereof is that the security device automatically works as soon as the packing or protective cover around the MRAM-array is opened, either from the top or from the back.

The present invention also provides a method for protecting from unauthorised read-out an array of MRAM-cells having a data content. The method comprises automatically destroying the data content of at least some of the MRAM-cells by a magnetic field when the array is tampered with.

The method may comprise generation of the magnetic field at the MRAM-cells by separating a soft-magnetic flux-closing layer from a magnetic field source such as for example a permanent magnet or an electromagnet.

A method according to the present invention may further comprise enhancement of the magnetic field at the MRAM-cells by a magnetic field shaping device located adjacent the array of MRAM-cells.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

FIG. 2 is a schematic illustration of the MRAM array of FIG. 1 when it is tampered with.

Figure 1:
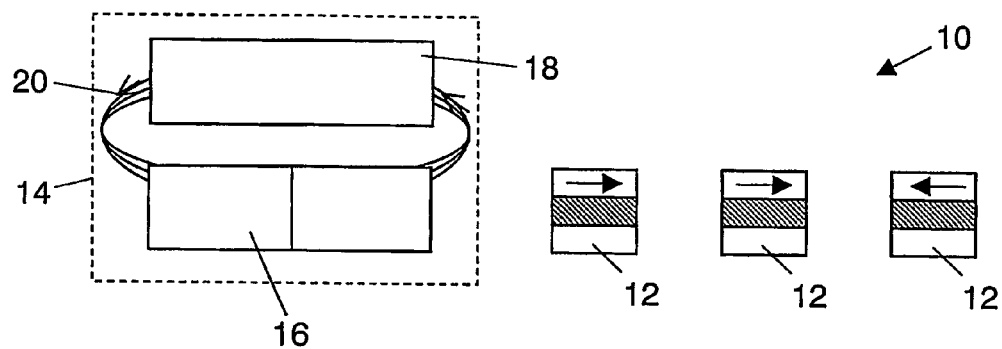
FIG. 1 is a schematic illustration of an unaffected MRAM array provided with a security device according to a first embodiment of the present invention.

In the different drawings, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

According to the present invention, an array 10 of MRAM-cells 12, having a data content is provided, which array 10 is protected with a security device 14, as shown in FIG. 1.

Figure 2:
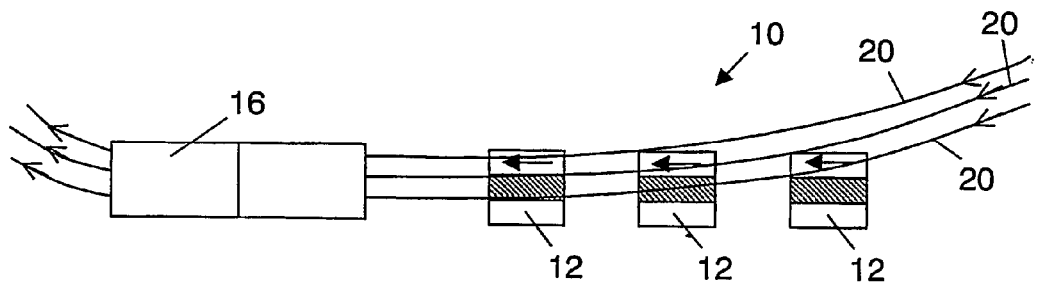

In a first embodiment of the present invention, the security device 14 comprises a permanent magnet 16, which for example, but not limited thereto, may be a thin-film magnet. The security device 14 also comprises a first soft-magnetic flux-closing layer 18 positioned adjacent, e.g. above, the permanent magnet 16. The layer 18 is sometimes known as a "keeper". The security device 14 is built near the MRAM array 10. As long as the soft-magnetic layer 18 is present adjacent, e.g. above, the permanent magnet 16, as in FIG. 1, magnetic field lines 20 of the permanent magnet 16 are deviated and flow through this soft-magnetic layer 18. The magnetic flux of the permanent magnet 16 is thus closed by the soft-magnetic layer 18. As soon as the soft-magnetic layer 18 is removed from the permanent magnet 16, i.e. when the MRAM device is tampered with, e.g. by opening its enclosure for example during reverse engineering, the magnetic field lines 20 are no longer deviated and extend over the array 10 of MRAM-cells 12 as shown in FIG. 2. The magnetic field lines 20 now effect the MRAM-cells 12 of the array 10, by changing the magnetization direction of the free layers of the MRAM-cells 12, thus destroying the stored data of at least some of the MRAM-cells 12 by changing their magnetization direction.

In a second embodiment of the present invention, not only a permanent magnet 16 and an adjacent first soft-magnetic layer 18 are provided, but also magnetic field shaping device is included. The magnetic field shaping device may be a second soft-magnetic layer 22. This second soft-magnetic layer 22 is located so that the permanent magnet 16 and the second soft-magnetic layer 22 each are at opposite sides of the MRAM-cells. For example, if the permanent magnet 16 is located at the left-hand side of the array 10 of MRAM-cells 12, the second soft-magnetic layer 22 is located at the right-hand side thereof as in FIG. 3. The magnetic field lines 20 from the magnet 16 will always try to go to the nearest soft-magnetic layer 18, 22. In the normal state the magnetic field lines 20 flow through the first soft-magnetic layer 18 adjacent the permanent magnet 16. In case of tampering, when the first soft-magnetic layer 18 is removed, e.g. during inverse engineering, the magnetic field lines 20 flow through the second soft-magnetic layer 22 at the other side (with respect to the position of the permanent magnet 16) of the MRAM-cells 12. An advantage of this embodiment over the first embodiment is that the magnetic field lines 20 now approach the MRAM-cells 12 better, and thus easier destroy the content of at least some of the MRAM-cells 12 by aligning the magnetization direction of their free layers with the direction of the magnetic field of the permanent magnet 16 of the security device 14.

As a further embodiment of the present invention, a normal shielding layer of the array 10 of MRAM-cells 12 can be used as flux-closing layer 18 for the permanent magnet 16. In this case, care has to be taken that the magnetic field lines 20 from the magnet 16 do not affect the shielding properties of the shielding layer too much. The magnetic field from the magnet should not be so high at the position of the shielding layer that it can saturate the shielding layer. The shielding layer of the array 10 of MRAM-cells 12 should therefore be thick enough so that it is not saturated by the field from the magnet, because in saturation it cannot serve as shielding anymore.

In the hereinabove described embodiments the protection is aimed at reverse engineering from the top, i.e. that side of a substrate 24 onto which the MRAM-cells 12 are implemented. By implementing a soft magnetic layer 26 below the plane of the MRAM-cells 12, with an additional permanent magnet 28 between the MRAM-cells 12 and this soft-magnetic layer 26, the protection works against reverse engineering from the substrate-side. This protection may be placed at the backside of the substrate 24, as shown in FIG. 4.

Figure 3:
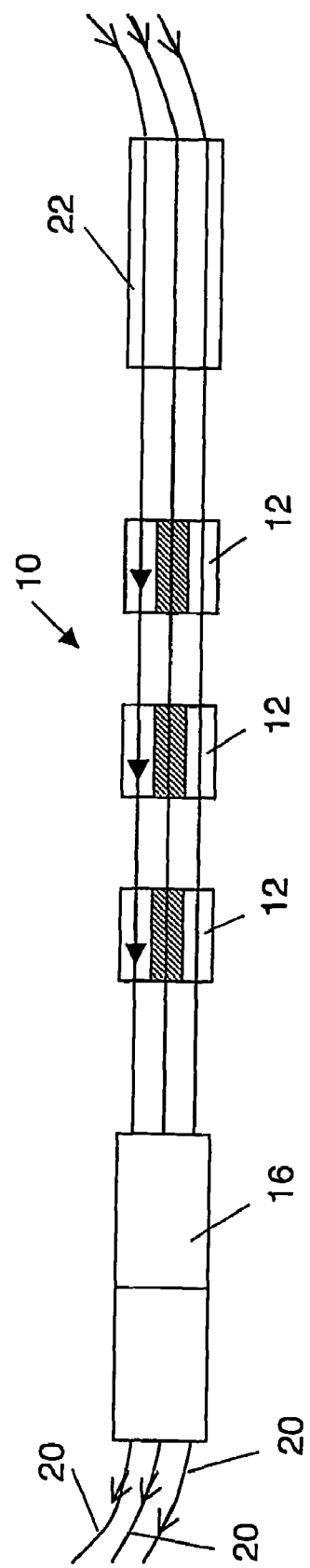
FIG. 3 is a schematic illustration of an MRAM array provided with a security device according to a second embodiment of the present invention.
Figure 4:
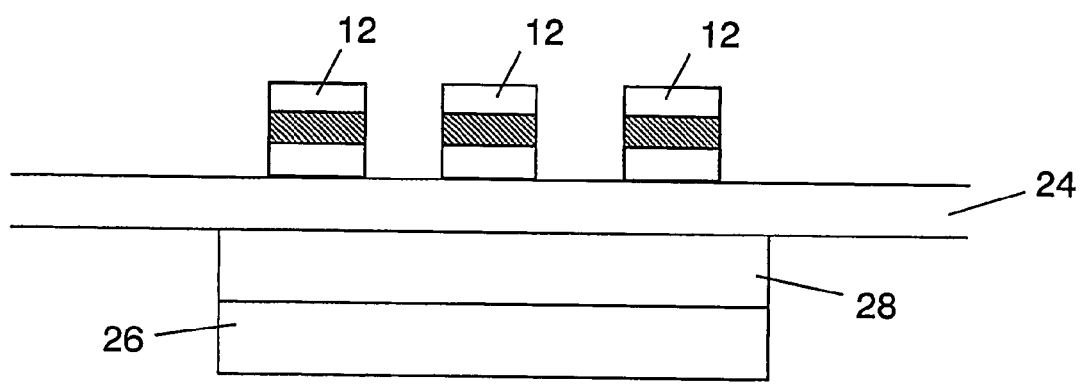
FIG. 4 is a schematic illustration of an MRAM array provided with a security device according to a further embodiment of the present invention.

The protection as shown in FIG. 4 can be combined e.g. with a security device 14 next to the array 10, as in FIG. 1 or with a security device next to the array 10 and a magnetic field shaping device 22 as in FIG. 3. In that case, distances should be chosen such that the field from magnet 16 will not be influenced too much by the soft magnetic layer 26, and that the field from magnet 28 will not be influenced too much by the soft magnetic layers 18 and/or 22.

Alternatively protection at the top and bottom side of the substrate 24 can be alternating i.e. when there is a topside protection 14 in a certain area of the memory array 10 there is no back protection and vice versa. Usually it is sufficiently effective if half of the data, which is moreover distributed over the memory area, is destroyed after tampering.

The present invention provides a hardware protection against tampering that can easily be added to an embedded or stand-alone MRAM. Especially in applications where security is essential, such as for example in smartcards, or in which the integrity of data is crucial, e.g. program code of the operation system in embedded MRAM in a System on Chip (SoC), the use of a security device according to the present invention may be of importance. The protection according to the present invention has the advantage of being passive, i.e. it does not require power to operate.

It is to be understood that although preferred embodiments, specific constructions and configurations have been discussed herein for devices according to the present invention, various changes or modifications in form and detail may be made without departing from the scope and spirit of this invention.

The invention claimed is:

1. A tamper-resistant memory device comprising:
   a plurality of MRAM-cells; and
   at least one security device coupled with said MRAM-cells, said security device including a magnetic source and a shielding layer;
   wherein the shielding layer deviates magnetic field lines of said magnetic source such that the plurality of MRAM-cells are unaffected by said magnetic field lines; and
   further wherein tampering with said tamper-resistant memory device comprises at least a partial removal of said shielding layer which causes said magnetic field lines to destroy at least some of the data stored in the plurality of MRAM-cells.

2. The tamper-resistant memory device of claim 1, wherein the magnetic source is a permanent magnet.

3. The tamper-resistant memory device of claim 1, wherein the shielding layer is a first soft-magnetic flux-closing layer.

4. The tamper-resistant memory device of claim 1, wherein said memory device is configured to cause said shielding layer to separate from said magnetic source when the memory device is subject to tampering.

5. The tamper-resistant memory device of claim 1 further comprising a magnetic field shaping device.

6. The tamper-resistant memory device of claim 4, wherein the magnetic field shaping device is a second soft-magnetic layer, the magnetic field source and first soft-magnetic layer being located adjacent the array of MRAM-cells at one side, and the second soft-magnetic layer being located adjacent the array of MRAM-cells at the opposite side thereof.

* * * * *